(12) United States Patent
Park et al.

(10) Patent No.: US 9,470,803 B2
(45) Date of Patent: Oct. 18, 2016

(54) X-RAY DETECTOR

(71) Applicant: Samsung Electronics Co., Ltd., Suwon-si, Gyeonggi-do (KR)

(72) Inventors: Jaechul Park, Yangju-si (KR); Sunil Kim, Osan-si (KR); Dongwook Lee, Suwon-si (KR); Changbum Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/725,429

(22) Filed: May 29, 2015

(65) Prior Publication Data

US 2016/0041274 A1 Feb. 11, 2016

(30) Foreign Application Priority Data

Aug. 6, 2014 (KR) .......................... 10-2014-0101102

(51) Int. Cl.
| | |
|---|---|
| *G01T 1/24* | (2006.01) |
| *H01L 31/0272* | (2006.01) |
| *H01L 31/032* | (2006.01) |
| *H01L 27/146* | (2006.01) |

(52) U.S. Cl.
CPC ........... *G01T 1/24* (2013.01); *H01L 27/14612* (2013.01); *H01L 27/14676* (2013.01); *H01L 27/14692* (2013.01); *H01L 31/0272* (2013.01); *H01L 31/032* (2013.01)

(58) Field of Classification Search
CPC .............. G01T 1/24; H01L 27/14609; H01L 27/14612; H01L 27/1462; H01L 27/14636; H01L 27/14676; H01L 31/0272; H01L 31/032

See application file for complete search history.

(56) References Cited

U.S. PATENT DOCUMENTS

| | | | | |
|---|---|---|---|---|
| 2002/0195566 | A1* | 12/2002 | Rodricks | ................. G01T 1/202 250/370.09 |
| 2003/0071930 | A1* | 4/2003 | Nagahiro | .......... G02F 1/136213 349/39 |
| 2005/0231656 | A1* | 10/2005 | den Boer | .......... H01L 27/14609 349/42 |

FOREIGN PATENT DOCUMENTS

| | | |
|---|---|---|
| JP | 2000330132 A | 11/2000 |
| JP | 2001284562 A | 10/2001 |
| KR | 1020030016536 A | 3/2003 |
| KR | 1020030029463 A | 4/2003 |
| KR | 1020080026277 A | 3/2008 |

\* cited by examiner

*Primary Examiner* — Whitney T Moore

(57) ABSTRACT

An X-ray detector may include: a thin film transistor (TFT) unit; and/or a capacitor unit. The capacitor unit may include two or more storage capacitors. The TFT unit may include: a gate electrode on one region of a substrate; a gate insulating layer on the gate electrode; an active layer on the gate insulating layer; and/or a source electrode and a drain electrode respectively on sides of the active layer.

18 Claims, 6 Drawing Sheets

X-RAY DETECTOR

CROSS-REFERENCE TO RELATED APPLICATION(S)

This application claims priority from Korean Patent Application No. 10-2014-0101102, filed on Aug. 6, 2014, in the Korean Intellectual Property Office (KIPO), the entire contents of which are incorporated herein by reference.

BACKGROUND

1. Field

Some example embodiments may relate generally to X-ray detectors.

2. Description of Related Art

X-rays may be used in various fields such as inspections of structures, inspections of physical properties of materials, image diagnoses, or security checks. A typical X-ray image system may include an X-ray generator for emitting X-rays and an X-ray detector for detecting X-rays transmitted by inspection objects.

In general, an X-ray generator may emit X-rays by making electrons, emitted from a cathode, collide with an anode. Electron-emitting devices which are applied to X-ray generators may be classified into cold cathodes and hot cathodes. Among them, electron-emitting devices which use field emission may be easily driven even at a low voltage. Therefore, a lot of research for commercialization of electron-emitting devices using field emission may have been conducted.

Examples of a method of detecting X-rays may include a method of detecting

X-rays by using an X-ray sensing film and/or a method of detecting X-rays by using an electrical manner. In the method of detecting X-rays by using an X-ray sensing film, X-rays transmitted by an inspection object may be photographed using an X-ray sensing film, and a photographed film may be developed. In the method of detecting X-rays by using an electrical manner, electrical charges which are generated by radiating X-rays transmitted by an inspection object to a sensing material may be read out by a thin film transistor.

SUMMARY

Some example embodiments may provide X-ray detectors.

In some example embodiments, an X-ray detector may comprise: a thin film transistor (TFT) unit; and/or a capacitor unit. The capacitor unit may comprise two or more storage capacitors.

In some example embodiments, the TFT unit may comprise: a gate electrode on one region of a substrate; a gate insulating layer on the gate electrode; an active layer on the gate insulating layer; and/or a source electrode and a drain electrode respectively on sides of the active layer.

In some example embodiments, the capacitor unit may comprise: a storage electrode spaced apart from the gate electrode on the substrate; an insulating layer on the storage electrode; a common electrode and a common electrode line on the insulating layer; a dielectric layer on the common electrode and the common electrode line; and/or a collection electrode on the dielectric layer.

In some example embodiments, the X-ray detector may further comprise: a photoconductive material layer on the collection electrode; and/or an upper electrode on the photoconductive material layer.

In some example embodiments, the photoconductive material layer may comprise amorphous selenium.

In some example embodiments, the photoconductive material layer may comprise $HgI_2$.

In some example embodiments, the collection electrode may extend onto the source electrode and the drain electrode. The X-ray detector may further comprise a passivation layer between the collection electrode and the source and drain electrodes.

In some example embodiments, the X-ray detector may further comprise: a first storage capacitor between the collection electrode and the common electrode; and/or a second storage capacitor between the common electrode and the storage electrode.

In some example embodiments, the collection electrode may be electrically connected to the source electrode and the storage electrode through a first via hole and a second via hole that include conductive material.

In some example embodiments, the capacitor unit may comprise: a storage electrode on the gate insulating layer spaced apart from the gate electrode; an insulating layer on the storage electrode; a common electrode and a common electrode line on the insulating layer; a dielectric layer on the common electrode and the common electrode line; and/or a collection electrode on the dielectric layer.

In some example embodiments, the X-ray detector may further comprise: a photoconductive material layer on the collection electrode; and/or an upper electrode on the photoconductive material layer.

In some example embodiments, the X-ray detector may further comprise: a passivation layer on the active layer, the source electrode, and the drain electrode. The collection electrode may extend onto the passivation layer.

In some example embodiments, the X-ray detector may further comprise: a first storage capacitor between the storage electrode and the common electrode; and/or a second storage capacitor between the common electrode and the collection electrode.

In some example embodiments, the collection electrode, the source electrode, and the storage electrode may be electrically connected to each other through a via hole that includes conductive material.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
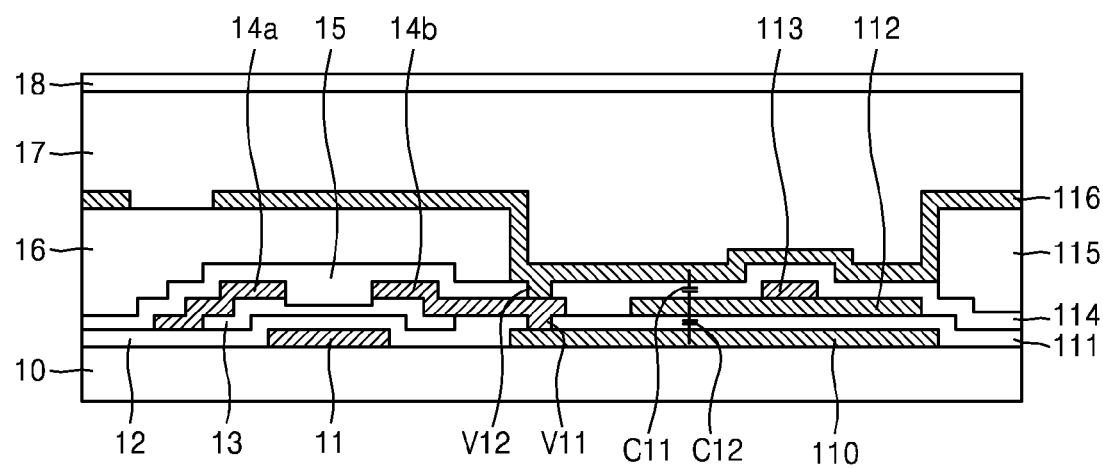
FIG. 1 is a cross-sectional view of an X-ray detector according to some example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a cross-sectional view of an X-ray detector according to some example embodiments.

The X-ray detector according to some example embodiments of the present disclosure may include a thin film transistor (TFT) unit and a capacitor unit. The capacitor unit may be formed to have a multi-storage capacitor structure including two or more storage capacitors. Referring to FIG. 1, the X-ray detector may include a gate electrode 11 formed on one region of a substrate 10, an gate insulating layer 12 formed on the gate electrode 11, and an active layer 13 formed on the gate insulating layer 12. A source electrode 14b and drain electrode 14a may be respectively formed on both sides of the active layer 13 and may form the TFT unit together with the gate electrode 11. A storage electrode 110 may be formed on the substrate 10 to be spaced apart from the gate electrode 11, an insulating layer 111 may be formed on the storage electrode 110, and a common electrode 112 and a common electrode line 113 may be formed on the insulating layer 111.

Dielectric layers 114 and 115 may be formed on the common electrode 112 and the common electrode line 113. The dielectric layers 114 and 115 may include a first dielectric layer 114 and a second dielectric layer 115, and a collection electrode 116 may be formed on the first and second dielectric layers 114 and 115. The collection electrode 116 may extend onto the TFT unit. The collection electrode 116 may be formed to extend onto the source electrode 14b and the drain electrode 14a.

Passivation layers 15 and 16 may be formed between the collection electrode 116 and the TFT unit, which includes the active layer 13, the source electrode 14b, and the drain electrode 14a. The passivation layers 15 and 16 may include a first passivation layer 15 and a second passivation layer 16. A photoconductive material layer 17 may be formed on the collection electrode 116, and an upper electrode 18 may be formed on the photoconductive material layer 17. The collection electrode 116 may be electrically connected to the source electrode 14b and the storage electrode 110 via a first via hole V11 and a second via hole V12 that include a conductive material.

A first storage capacitor C11 may be formed between the collection electrode 116 and the common electrode 112, and a second storage capacitor C12 may be formed between the common electrode 112 and the storage electrode 110. The capacitor unit may be implemented by using a multi-capacitor including the first storage capacitor C11 and the second storage capacitor C12.

Figure 2:
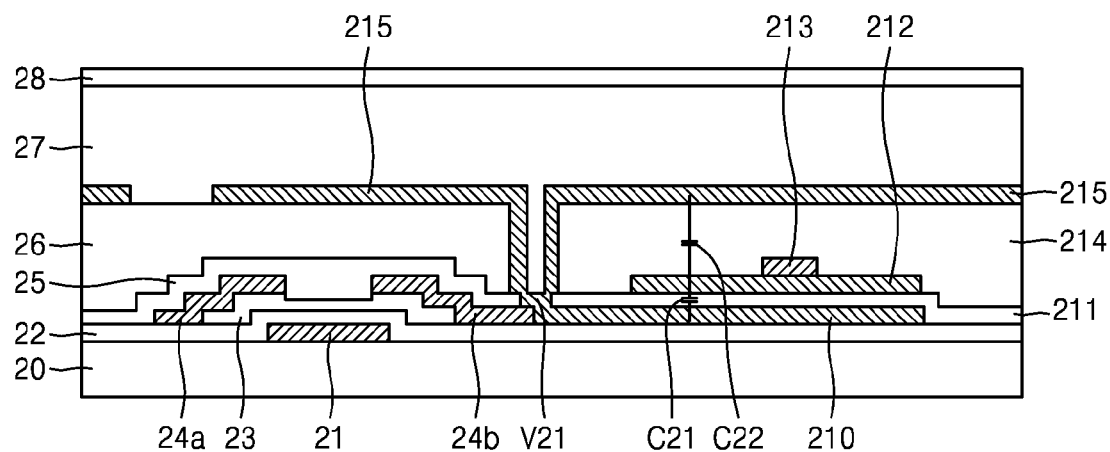
FIG. 2 is a cross-sectional view of an X-ray detector according to some example embodiments.

FIG. 2 is a cross-sectional view of an X-ray detector according to some example embodiments.

Referring to FIG. 2, the X-ray detector may include a TFT unit and a capacitor unit. The TFT unit may include a gate electrode 21 formed on one region of a substrate 20, a gate insulating layer 22 formed on the gate electrode 21, and an active layer 23 formed on the gate insulating layer 22. A source electrode 24b and a drain electrode 24a may be respectively formed on both sides of the active layer 23. The source electrode 24b and the drain electrode 24a may form the TFT unit together with the gate electrode 21. A storage electrode 210 may be formed on the substrate 20 and the gate insulating layer 22 such as to be spaced apart from the gate electrode 21. An insulating layer 211 may be formed on the storage electrode 210, and a common electrode 212 and a common electrode line 213 may be formed on the insulating layer 211.

A dielectric layer 214 may be formed on the common electrode 212 and the common electrode line 213, and a collection electrode 215 may be formed on the dielectric layer 214.

Passivation layers 25 and 26 may be formed on the active layer 23, the source electrode 24b, and the drain electrode 24a of the TFT unit, and the collection electrode 215 may extend onto the passivation layers 25 and 26. The passivation layer 25 and 26 may include a first passivation layer 25 and a second passivation layer 26. A photoconductive material layer 27 may be formed on the collection electrode 215, and an upper electrode 28 may be formed on the photoconductive material layer 27. The collection electrode 215 may be connected to the source electrode 24b of the TFT unit, and may also be connected to the storage electrode 210. The collection electrode 215, the source electrode 24b, and the storage electrode 210 may be electrically connected to each other through a via hole V21 that includes a conductive material.

A first storage capacitor C21 and a second storage capacitor C22 may be respectively formed between the common electrode 212 and the storage electrode 210, and between the common electrode 212 and the collection electrode 215. As such, the capacitor unit of the X-ray detector according to some example embodiments of the present disclosure may be implemented by using a multi-capacitor including the first storage capacitor C21 and the second storage capacitor C22.

The X-ray detectors according to some example embodiments of the present disclosure shown in FIGS. 1 and 2 may respectively include the capacitor units respectively connected to the source electrodes 14b and 24b of the TFT units. The capacitor units of FIGS. 1 and 2 may respectively have a structure including a dual-storage capacitor or a multi-storage capacitor including the second storage capacitor C12 formed between the common electrode 112 and the storage electrode 110 and the first storage capacitor C11 formed between the common electrode 112 and the collection electrode 116 and a structure including a dual-storage capacitor or a multi-storage capacitor including the first storage capacitor C21 formed between the common electrode 212 and the storage electrode 210 and the second storage capacitor C22 formed between the common electrode 212 and the collection electrode 215.

Figure 3:
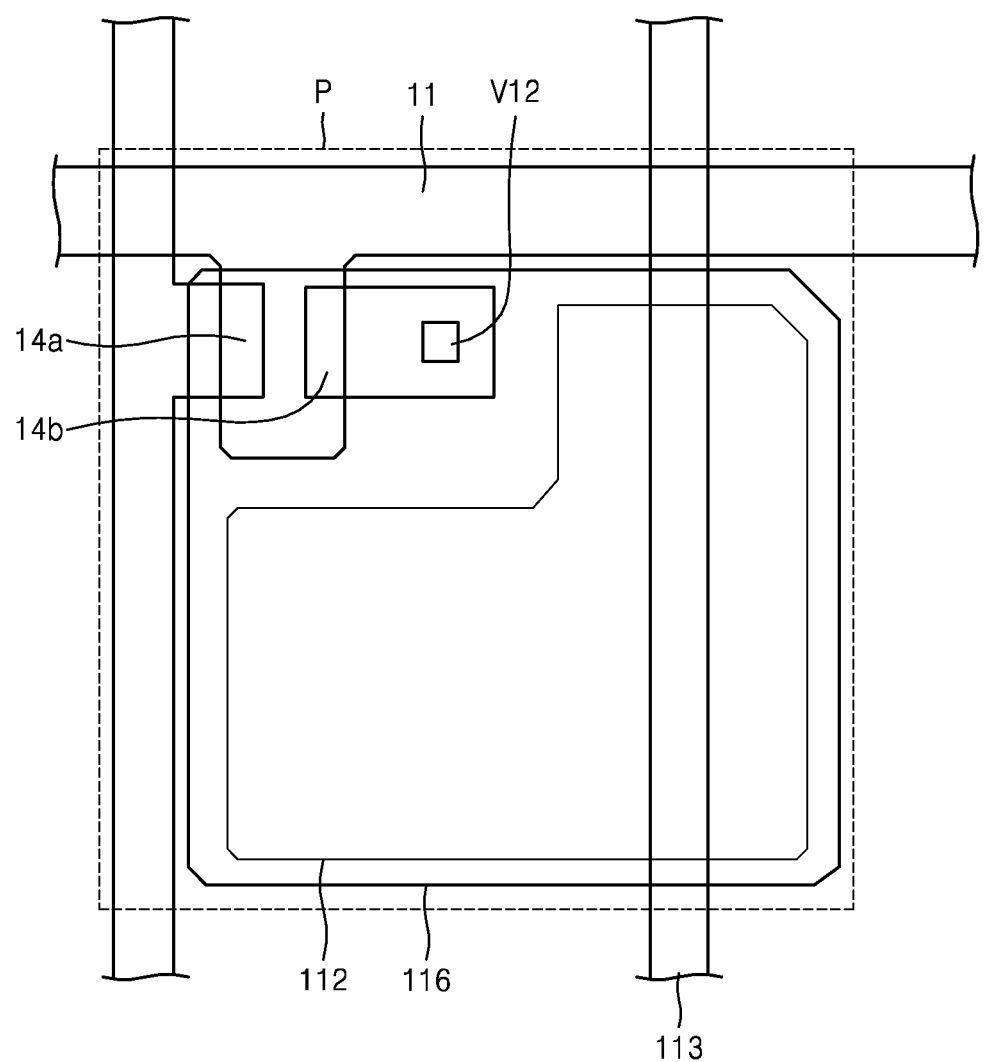
FIG. 3 is a diagram schematically illustrating a circuit structure of an X-ray detector, according to some example embodiments.

FIG. 3 is a diagram schematically illustrating a wiring structure of the X-ray detector according to some example embodiments.

Referring to FIGS. 1 and 3, the photoconductive material layer 17 of the X-ray detector absorbs the X-rays radiated to the upper electrode 18 and thus may generate electron-hole pairs. An electric field may be formed in the photoconductive layer 17 when a voltage is applied to the upper electrode 18, and the electron-hole pairs are separated by the electric field. Electrons may move toward the collection electrode 116, when the voltage characteristics of the upper electrode 18, for example, a negative voltage, are applied to the upper electrode 18. The moved electrons may be stored in the first storage capacitor C11 and the second storage capacitor C12. Thus, when a dual-storage capacitor is formed by respectively forming the first storage capacitor C11 and the second storage capacitor C12 on a top and a bottom of the common electrode 112, the capacitance of the capacitor may improve, compared with when a single storage capacitor is formed. When a TFT is turned on by applying a gate voltage on the gate electrode 11 of the TFT structure of the X-ray detector according to some example embodiments of the present disclosure, the electrons stored in the first and second storage capacitors C11 and C12 may move in a direction from the source electrode 14b of the TFT structure to the drain electrode 14a thereof and may move to a data processing unit outside the X-ray detector according to some example embodiments of the present disclosure. The first storage capacitor C11 and the second storage capacitor C12 may be connected to the source electrode 14b in parallel.

The X-ray detector may be used for various purposes, and the size of a unit pixel P of the X-ray detector tends to decrease in order to obtain a high resolution and high-definition diagnostic image, due to the use of the X-ray detector.

Figure 4:
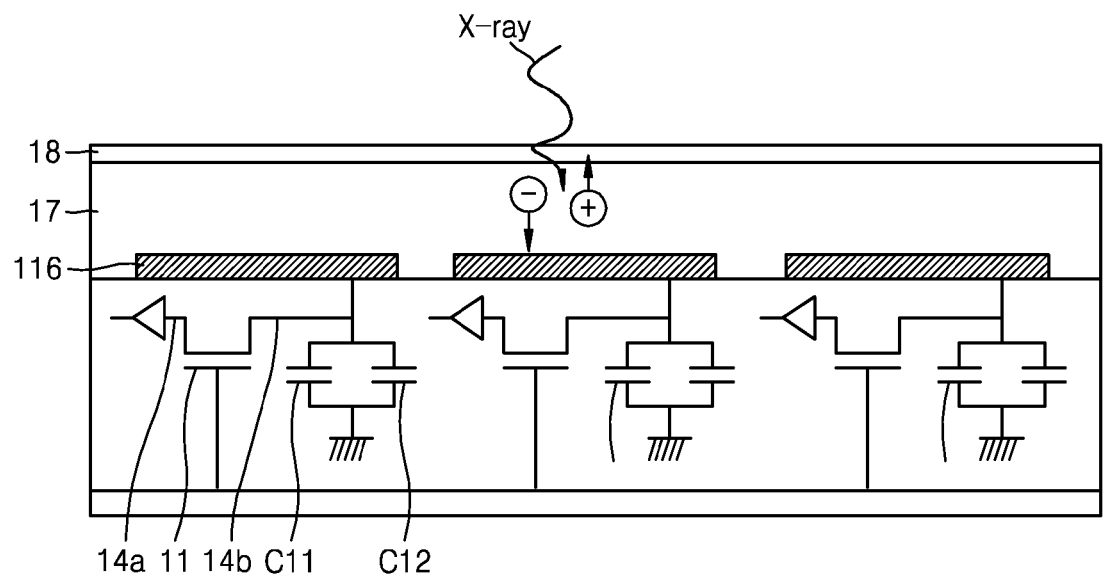
FIG. 4 is a plan view schematically illustrating a wiring structure of an X-ray detector, according to some example embodiments.

FIG. 4 is a plan view illustrating a wiring structure of the X-ray detector according to some example embodiments. Referring to FIGS. 1 and 4, as the size of a unit pixel P of the X-ray detector decreases, the area of the common electrode 112 may also decrease, and accordingly the capacitance of the storage capacitor may be reduced. For example, an X-ray detector for mammography may need a high-resolution TFT back plane in order to detect lesions of objects. The electric charges generated in the photoconductive material layer 17 needs to be stored to obtain high-definition X-ray images. In the X-ray detector according to some example embodiments of the present disclosure, a dual-storage capacitor may be formed by forming the first storage capacitor C11 between the common electrode 112 and the collection electrode 116 formed over the common electrode 112, and by forming the second storage capacitor C12 between the common electrode 112 and the storage electrode 110 formed below the common electrode 112. Therefore, although the size of the unit pixel P of the X-ray detector decreases, the capacitance of the storage capacitor may be increased, or the reduction of the capacitance of the storage capacitor may be suppressed.

FIGS. 5A through 5H are cross-sectional views for explaining a method of manufacturing an X-ray detector according to some example embodiments. A method of manufacturing the X-ray detector shown in FIG. 1 according to some example embodiments is illustrated.

Figure 5A:
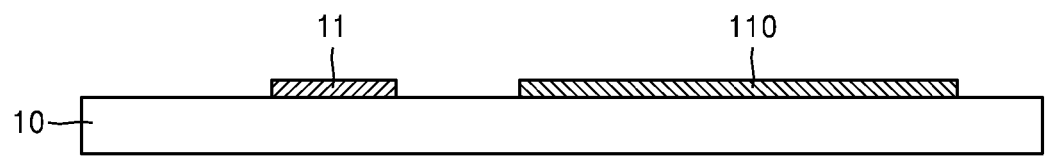
FIGS. 5A through 5H are cross-sectional views for explaining a method of manufacturing an X-ray detector, according to some example embodiments.

Referring to FIG. 5A, the gate electrode 11 and the storage electrode 110 are respectively formed of a conductive material on the substrate 10. The gate electrode 11 and the storage electrode 110 may be respectively a part of the TFT unit and a part the capacitor unit. The gate electrode 11 and the storage electrode 110 may be formed to be spaced apart from each other. Any material which is used to form a substrate of an electronic device may be used to form the substrate 10. For example, a silicon (Si) substrate or a glass substrate may be used as the substrate 10. The gate electrode 11 and the storage electrode 110 may be formed of a conductive material. The gate electrode 11 and the storage electrode 110 may be formed of a metal, an alloy, conductive metal oxide, conductive metal nitride, or a conductive polymer in a single-layer or multi-layer structure. For example, the gate electrode 11 and the storage electrode 110 may be formed of metal, such as nickel (Ni), copper (Cu), silver (Ag), gold (Au), aluminum (Al), platinum (Pt), titanium (Ti), tungsten (W), ruthenium (Ru), or tantalum (Ta), or indium-tin-oxide (ITO).

Figure 5B:
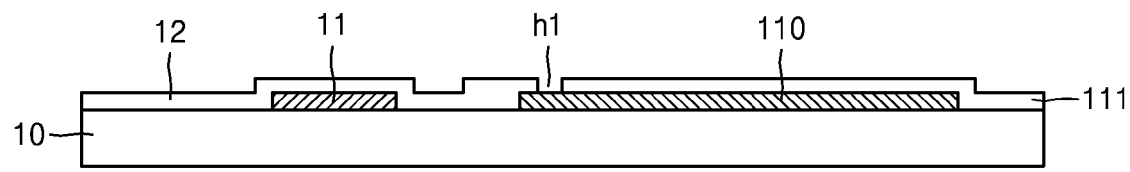

Referring to FIG. 5B, the gate insulating layer 12 and the insulating layer 111 may be formed by coating an insulating material on the substrate 10 and the storage electrode 110. A hole h1 may be formed between the gate insulating layer 12 and the insulating layer 111 by using a patterning process. The insulating material may be formed of oxide, such as silicon oxide, or nitride. The insulating material may be formed of a material having a higher dielectric constant than silicon oxide, for example, silicon nitride, aluminum oxide, or hafnium oxide.

Figure 5C:
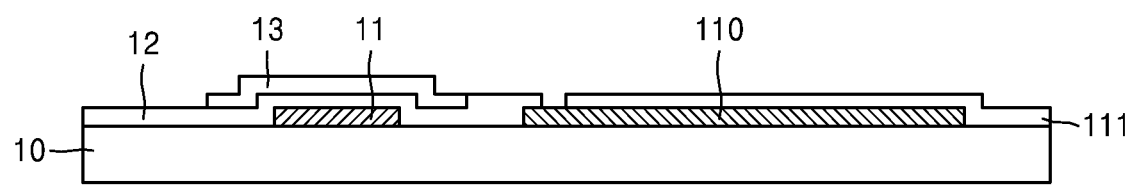
Figure 5D:
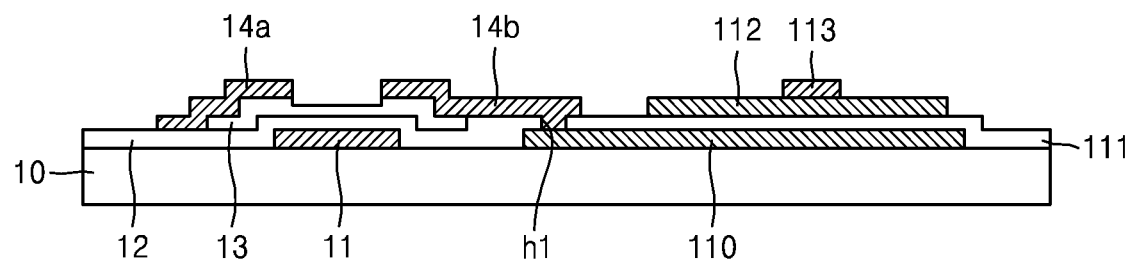

Referring to FIG. 5C, the active layer 13 may be formed on the gate insulating layer 12. The active layer 13 may be formed on a portion of the gate insulating layer 12 that faces the gate electrode 11. The active layer 13 may be formed of amorphous silicon or an oxide semiconductor.

Referring to 5D, the source electrode 14b and the drain electrode 14a may be formed of a conductive material on the active layer 13, and the common electrode 112 and the common electrode line 113 may be formed of the conductive material. The conductive material may be a metal, an alloy, conductive metal oxide, conductive metal nitride, conductive polymer, or the like. When the source electrode 14b is formed, the hole h1 may be filled with the conductive material.

Figure 5E:
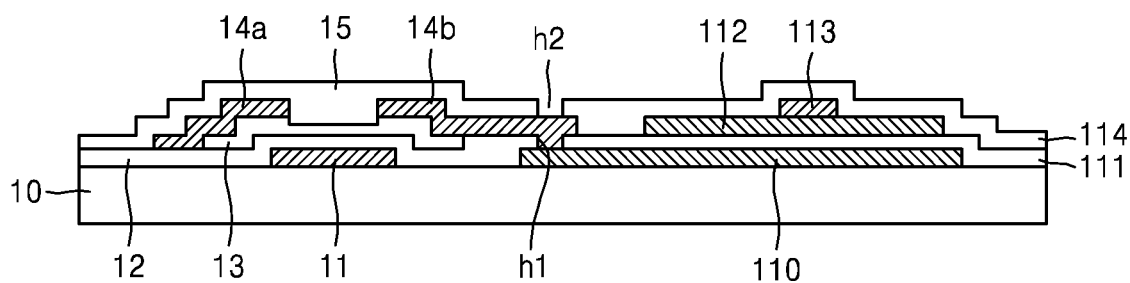

Referring to FIG. 5E, the first passivation layer 15 and the first dielectric layer 114 may be formed by coating an insulating material. A hole h2 may be formed using a patterning process, after coating the insulating material. The insulating material used to form the first passivation layer 15 and first dielectric layer 114 may be silicon oxide, silicon nitride, or other organic insulating material.

Figure 5F:
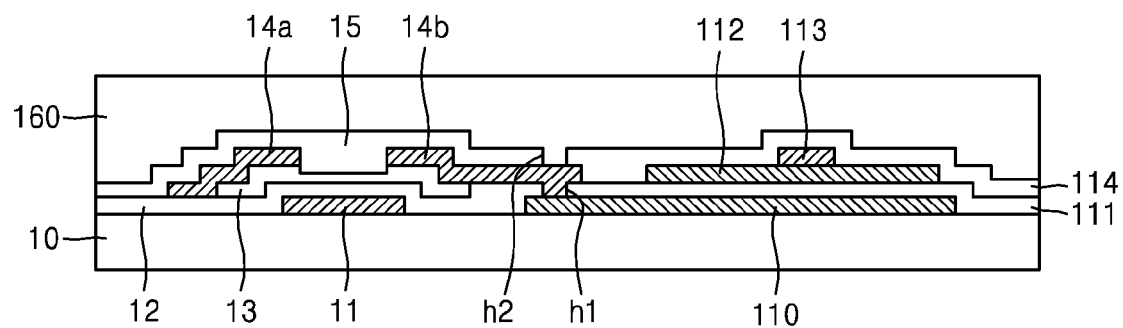
Figure 5G:
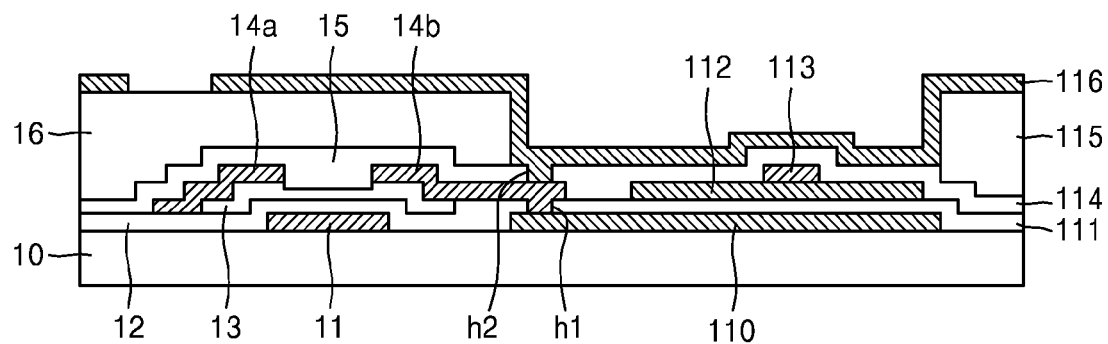

Referring to FIG. 5F, an additional insulating material 160 is further coated. The insulating material 160 may be silicon oxide, silicon nitride, or other organic insulating material. Referring to FIG. 5G, the second passivation layer 16 and the second dielectric layer 115 may be formed by etching a portion of the insulating material 160 coated in FIG. 5F. The etched portion may be a portion corresponding to a region in which the common electrode 112 and the common electrode line 113 are formed. The collection electrode 116 may be formed by coating a conductive material on the second passivation layer 16 and the second dielectric layer 115. The collection electrode 116 may be formed of a metal, an alloy, conductive metal oxide, conductive nitride, or a conductive polymer in a single-layer or multi-layer structure.

Figure 5H:
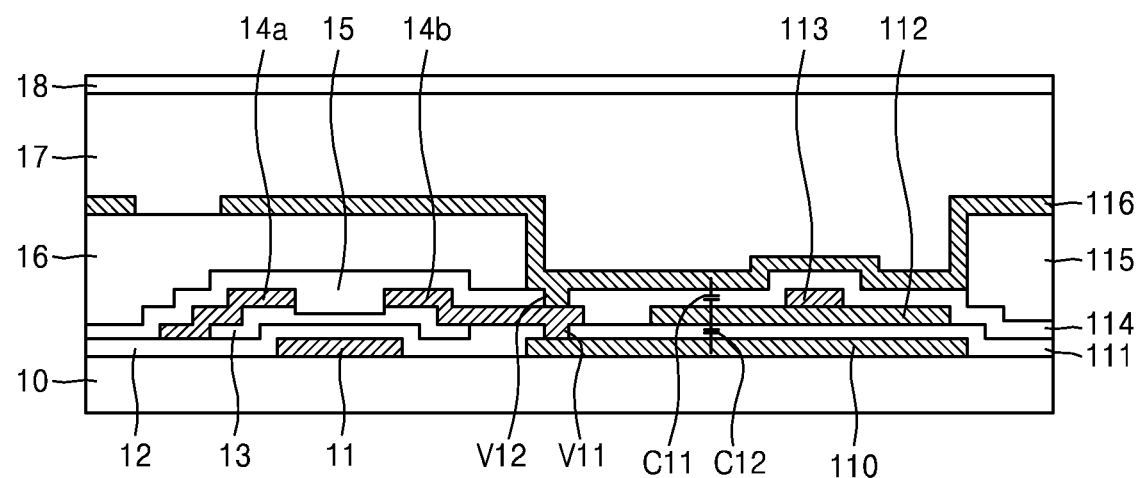

Referring to FIG. 5H, the photoconductive material layer 17 may be formed by coating a photoconductive material on the collection electrode 116. The photoconductive material layer 17 is formed of a material capable of generating electric charges when being irradiated by X-rays, that is, any of various kinds of photoconductive materials. For example, the photoconductive material layer 17 may be formed of amorphous selenium or $HgI_2$. The upper electrode 18 may be formed of a conductive material on the photoconductive material layer 17. The upper electrode 18 may be formed to generate an electric field in the photoconductive material layer 17 when power is applied to the upper electrode 18. The upper electrode 18 may be formed of, for example, ITO. Optionally, an insulating layer may be further formed of an insulating material, such as silicon oxide, between the photoconductive material layer 17 and the upper electrode 18. Due to the further formation of the insulating layer between the photoconductive material layer 17 and the upper electrode 18, the leakage of electrons and holes in the photoconductive material layer 17 may be prevented.

As described above, according to some example embodiments of the present disclosure, an X-ray detector may include a multi-storage capacitor. Although the area of a common electrode is reduced by decreasing the size of a unit pixel of the X-ray detector in order to improve integration, the capacitance of the capacitor may be increased or a reduction in the capacitance of the capacitor may be suppressed, due to the inclusion of a multi-storage capacitor.

It should be understood that the example embodiments described herein should be considered in a descriptive sense only and not for purposes of limitation. Descriptions of features or aspects within each embodiment should typically be considered as available for other similar features or aspects in other embodiments.

While some example embodiments have been described with reference to the figures, it will be understood by those of ordinary skill in the art that various changes in form and details may be made therein without departing from the spirit and scope of the present disclosure as defined by the following claims.

What is claimed is:

1. An X-ray detector, comprising:
    a thin film transistor (TFT) unit, wherein the TFT unit comprises a source electrode and a drain electrode;
    a capacitor unit, wherein the capacitor unit comprises two or more storage capacitors and a collection electrode, wherein the collection electrode extends onto the source electrode and the drain electrode; and
    a passivation layer between the collection electrode and the source and drain electrodes.

2. The X-ray detector of claim 1, wherein the TFT unit further comprises:
    a gate electrode on one region of a substrate;
    a gate insulating layer on the gate electrode; and
    an active layer on the gate insulating layer;
    wherein the source electrode and the drain electrode are formed on sides of the active layer.

3. The X-ray detector of claim 2, wherein the capacitor unit further comprises:
    a storage electrode spaced apart from the gate electrode on the substrate;
    an insulating layer on the storage electrode;
    a common electrode and a common electrode line on the insulating layer; and
    a dielectric layer on the common electrode and the common electrode line;
    wherein the collection electrode is formed on the dielectric layer.

4. The X-ray detector of claim 3, wherein the storage capacitors comprise:
    a first storage capacitor between the collection electrode and the common electrode; and
    a second storage capacitor between the common electrode and the storage electrode.

5. The X-ray detector of claim 3, wherein the collection electrode is electrically connected to the source electrode and the storage electrode through a first via hole and a second via hole that include conductive material.

6. The X-ray detector of claim 3, further comprising:
    a photoconductive material layer on the collection electrode; and
    an upper electrode on the photoconductive material layer.

7. The X-ray detector of claim 6, wherein the photoconductive material layer comprises amorphous selenium or $HgI_2$.

8. The X-ray detector of claim 1, wherein the passivation layer comprises a first passivation layer and a second passivation layer.

9. An X-ray detector, comprising:
    a thin film transistor (TFT) unit, wherein the TFT unit comprises:
        a gate electrode on one region of a substrate;
        a gate insulating layer on the gate electrode;
        an active layer on the gate insulating layer; and
        a source electrode and a drain electrode on sides of the active layer;
    a capacitor unit comprising two or more storage capacitors, wherein the capacitor unit comprises:
        a storage electrode on the gate insulating layer spaced apart from the gate electrode;
        an insulating layer on the storage electrode;
        a common electrode and a common electrode line on the insulating layer;

a dielectric layer on the common electrode and the common electrode line; and
a collection electrode on the dielectric layer; and
a passivation layer on the active layer, the source electrode, and the drain electrode, wherein the collection electrode extends onto the passivation layer.

10. The X-ray detector of claim 9, further comprising:
a photoconductive material layer on the collection electrode; and
an upper electrode on the photoconductive material layer.

11. The X-ray detector of claim 9, wherein the storage capacitors comprise:
a first storage capacitor between the storage electrode and the common electrode; and
a second storage capacitor between the common electrode and the collection electrode.

12. The X-ray of claim 9, wherein the collection electrode, the source electrode, and the storage electrode are electrically connected to each other through a via hole that includes conductive material.

13. An X-ray detector, comprising:
a thin film transistor (TFT) unit, wherein the TFT unit comprises:
a gate electrode on one region of a substrate;
a gate insulating layer on the gate electrode;
an active layer on the gate insulating layer; and
a source electrode and a drain electrode on sides of the active layer;
a capacitor unit comprising two or more storage capacitors, wherein the capacitor unit comprises:
a storage electrode spaced apart from the gate electrode on the substrate;
an insulating layer on the storage electrode;
a common electrode and a common electrode line on the insulating layer;
a dielectric layer on the common electrode and the common electrode line; and
a collection electrode on the dielectric layer; and
a passivation layer between the collection electrode and the source and drain electrodes, wherein the collection electrode extends onto the source electrode and the drain electrode.

14. The X-ray detector of claim 13, further comprising:
a photoconductive material layer on the collection electrode; and
an upper electrode on the photoconductive material layer.

15. The X-ray detector of claim 14, wherein the photoconductive material layer comprises amorphous selenium or $HgI_2$.

16. The X-ray detector of claim 13, wherein the storage capacitors comprise:
a first storage capacitor between the collection electrode and the common electrode; and
a second storage capacitor between the common electrode and the storage electrode.

17. The X-ray detector of claim 13, wherein the collection electrode is electrically connected to the source electrode and the storage electrode through a first via hole and a second via hole that include conductive material.

18. The X-ray detector of claim 13, wherein the passivation layer comprises a first passivation layer and a second passivation layer.

* * * * *